(12) United States Patent
Briggs et al.

(10) Patent No.: US 9,881,431 B2
(45) Date of Patent: *Jan. 30, 2018

(54) SECURITY KEY SYSTEM

(71) Applicant: International Business Machines Corporation, Armonk, NY (US)

(72) Inventors: Benjamin D. Briggs, Waterford, NY (US); Lawrence A. Clevenger, LaGrangeville, NY (US); Bartlet H. DeProspo, Goshen, NY (US); Michael Rizzolo, Albany, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/164,136

(22) Filed: May 25, 2016

(65) Prior Publication Data
US 2017/0221285 A1    Aug. 3, 2017

Related U.S. Application Data

(63) Continuation of application No. 15/009,953, filed on Jan. 29, 2016, now Pat. No. 9,418,327.

(51) Int. Cl.
*G06K 19/06*    (2006.01)
*G07C 9/00*    (2006.01)
*G06K 7/14*    (2006.01)

(52) U.S. Cl.
CPC ....... *G07C 9/00007* (2013.01); *G06K 7/1417* (2013.01); *G06K 19/06037* (2013.01); *G06K 19/06178* (2013.01)

(58) Field of Classification Search
CPC ........... Y10T 70/7062; Y10T 29/49004; Y10T 29/49124; Y10T 428/24355; Y10T 70/413; Y10T 70/446; Y10T 70/7079; Y10T 70/7107; Y10T 70/7136; Y10T 70/7441; Y10T 70/7554; Y10T 70/7588; Y10T 70/7605
USPC ................................. 235/491, 488
See application file for complete search history.

(56) References Cited

U.S. PATENT DOCUMENTS

| | | | | |
|---|---|---|---|---|
| 2004/0018297 | A1* | 1/2004 | Davidson | H01L 23/145 427/58 |
| 2004/0182923 | A1* | 9/2004 | Bench | E05B 49/006 235/382 |
| 2004/0238783 | A1* | 12/2004 | Bullock | B82Y 25/00 252/62.54 |
| 2009/0008925 | A1* | 1/2009 | Blondiaux | G07D 7/00 283/85 |

(Continued)

OTHER PUBLICATIONS

Briggs, Benjamin D., et al., "Security Key System", U.S. Appl. No. 15/212,803, filed Jul. 18, 2016.

(Continued)

*Primary Examiner* — Thien M Le
(74) *Attorney, Agent, or Firm* — Cantor Colburn LLP (57) ABSTRACT

An aspect of the disclosure includes a security system and method having a key with nanoscale features. The key includes a body. At least one pattern member disposed on the body, the pattern member formed using a directed self-assembly polymer to define a pattern of random feature structures thereon, the feature structures having a width of less than 100 nanometers.

20 Claims, 7 Drawing Sheets

(56) References Cited

U.S. PATENT DOCUMENTS

2014/0002929 A1* 1/2014 Takizawa ............ G11B 5/3163
360/135

OTHER PUBLICATIONS

List of IBM Patents or Patent Applications Treated as Related; YOR920151355US3, Date Filed: May 25, 2016, pp. 1-2.

* cited by examiner

SECURITY KEY SYSTEM

DOMESTIC PRIORITY

This application is a continuation of U.S. patent application Ser. No. 15/009,953, filed Jan. 29, 2016, the content of which is incorporated by reference herein in its entirety.

BACKGROUND

The present invention relates generally to a security system and, more specifically, to a security system having a key that includes nanometer scale features.

Security systems may be used in a variety of applications to prevent access to unauthorized users. Security systems may be used to control access to a physical location, such as an office, a bank vault or a safe deposit box for example. Security systems may also be used with electronic systems, such as financial computer systems for example. In either application, the security system may include a physical key that the user engages with the security system to validate their authorization to access the secured area or system.

Traditionally the physical key had physical features (e.g. grooves and ridges) that engaged corresponding features within the lock (e.g. a pin and tumbler lock). When the key features match the lock features, the lock is disengaged. The physical features of the key were typically ground into the key, typically on a scale of millimeters in size. Thus the size of the features was limited by the fabrication process. More recently, keys and locks have been made available that allow for laser etched key features, radio frequency identification (RFID) circuits and magnetic circuits. This allowed for the "features" of the key to be made smaller (e.g. micron scale) and increased in number, making it more difficult for an unauthorized person to copy a key.

SUMMARY

Embodiments include a security system and method having a key with nanoscale features. The key includes a body. At least one pattern member disposed on the body, the pattern member formed using a directed self-assembly polymer to define a pattern of random feature structures thereon, the feature structures having a width of less than 100 nanometers.

In an embodiment, the at least one pattern member includes a plurality of pattern members, each of the pattern members being formed using the directed self-assembly polymer to define the pattern of random feature structures thereon, each of the pattern of random feature structures being different from the other patterns of random feature structures. This provides for increasing the number of combinations that may be measured for authenticating the key.

In an embodiment, the key further comprises at least a pair of contacts coupled to the body and electrically coupled to the pattern member. This provides for a mechanism for measuring electrical parameters of the pattern member.

In an embodiment, the at least a pair of contacts includes a plurality of pairs of contacts, each of pairs of the plurality of pairs of contacts being electrically coupled to one of the pattern members of the plurality of pattern members. This provides for a mechanism for measuring each of the pattern members on the body and increasing the number of combinations that may be measured for authenticating the key.

In an embodiment, the at least a pair of contacts includes a plurality of contacts, each of the plurality of contacts being arranged with two other contacts to electrically couple two pattern members of the plurality of pattern members. This provides for still further combinations that may be measured for authenticating the key since each of the plurality of pattern members may be measured individually, or in combination with one or more other pattern members.

In an embodiment, the body includes a first side and a second side. A first plurality of pattern members of the plurality of pattern members is arranged on the first side and a second plurality of pattern members of the plurality of pattern members is arranged on the second side. This provides additional area to place more pattern members and further increase the number of combinations used in authenticating the key.

In an embodiment, the body includes a third side and a fourth side. The plurality of pattern members further includes a third plurality of pattern members arranged on the third side and a fourth plurality of pattern member arranged on the fourth side. This provides still further additional area to place more pattern members and further increase the number of combinations used in authenticating the key.

In an embodiment, each of the plurality of pattern members has a feature pitch of 200 in a first direction and a second direction. This provides for increased density of the pattern members while providing space for the contacts.

In an embodiment, the key further includes a radio frequency identification circuit coupled to the body. This provides for a secondary authentication circuit in addition to the pattern members.

In accordance with another embodiment a security system is provided. The security system including a key having a body with at least one pattern member disposed on the body, the pattern member formed using a directed self-assembly polymer to define a pattern of random feature structures thereon, the feature structures having a width of less than 100 nanometers. A receptacle is provided having an opening sized to receive the body and at least a pair of probes operably coupled to the receptacle, the at least a pair of probes being positioned to operably communicate with the at least one pattern member to measure a parameter.

In an embodiment, the parameter is a measurement of resistance, voltage or capacitance between the pairs of contacts. This provides for increasing the number of combinations that may be formed in authenticating the key.

In an embodiment, the at least a pair of probes are configured to transmit a radio frequency signal and the at least one pattern member is configured to reflect the radio frequency signal. This provides for a non-contact means of measuring the parameter.

In accordance with another embodiment, a method is provided. The method includes arranging a first directed self-assembly polymer having a first length on a substrate. A second directed self-assembly polymer is arranged having a second directed self-assembly polymer having a second length on the substrate, an end of the second directed self-assembly polymer being coupled to an end of the first directed self-assembly polymer. The first directed self-assembly polymer and the second self-assembly polymer are solidified on the substrate. The second self-assembly polymer is removed to define a pattern by the first directed self-assembly polymer, the pattern being defined by a plurality of random feature structures thereon, the feature structures having a width of less than 100 nanometers. A pattern member is formed by metalizing the first directed self-assembly polymer. The pattern member is coupled to a key body. A key parameter of the pattern member is measured. The key body is engaged with a receptacle. A measured parameter of the key body is measured. A security system is disengaged based the measured parameter being equal to the key parameter.

Additional features and advantages are realized through the techniques of the present invention. Other embodiments and aspects of the invention are described in detail herein and are considered a part of the claimed invention. For a better understanding of the invention with the advantages and the features, refer to the description and to the drawings.

BRIEF DESCRIPTION OF THE DRAWINGS

The subject matter which is regarded as the invention is particularly pointed out and distinctly claimed in the claims at the conclusion of the specification. The forgoing and other features, and advantages of the invention are apparent from the following detailed description taken in conjunction with the accompanying drawings in which:

DETAILED DESCRIPTION

Embodiments of the present disclosure provide for a system and method for authenticating a security key having authentication features at not visible using optical metrology. Embodiments of the present disclosure provide for a system and method of authenticating a security key having at least one member having a random pattern with nanoscale features formed thereon. Still further embodiments provide for a method of fabricating a security key with at least one member having a random pattern with nanoscale features formed thereon.

Figure 1:
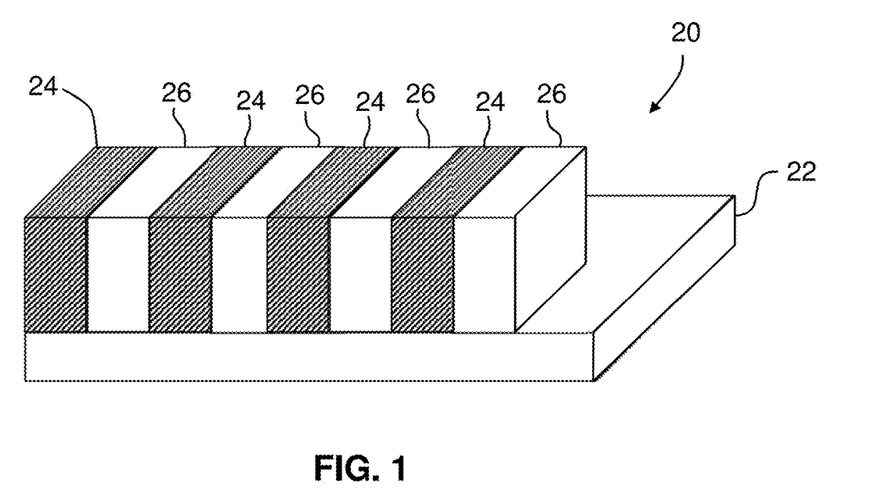
FIG. 1 depicts a perspective view of a pattern member being formed from directed self-assembly polymers, in accordance with some embodiments of this disclosure.
Figure 2:
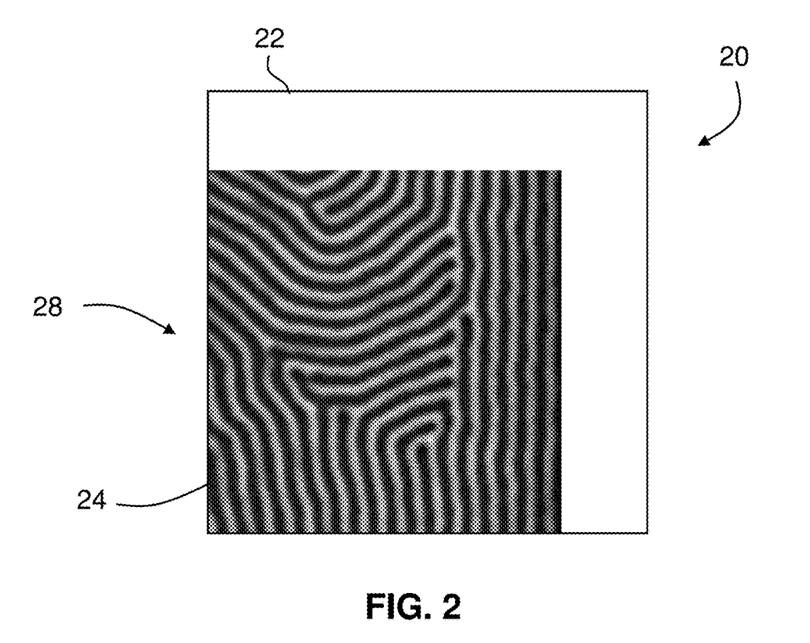
FIG. 2 depicts a top view of the pattern member of FIG. 1, according to some embodiments of this disclosure.

Referring now to FIG. 1 an embodiment is shown of a pattern member 20 being formed from directed self-assembly polymers. In an embodiment, the pattern member 20 includes a substrate 22 having a first polymer 24 and a second polymer 26 formed thereon. The substrate 22 may be a planar surface as shown or a curved surface. However, the surface of the substrate 22 is substantially smooth and does not have any guiding patterns formed thereon. The first polymer 24 has a first length and the second polymer 26 has a second length, the first length being different than the second length. The polymers are coupled end to end in an alternating pattern. The polymers 22, 24 are solidified and the second polymer 24 is removed as is known in the art. As a result, the first polymer 22 forms a random feature structure 28 on the substrate 22 as shown in FIG. 2. The random feature structure 28 may form valleys and ridges similar to a fingerprint. In the exemplary embodiment, a poly(styrene-block-methymethacrylate) (PS-b-PMMA) polymer may be used.

The random feature structure 28 defines a plurality of lines on the surface of the substrate 22. In an embodiment, the lines are randomly oriented and shaped, but have a generally uniform width. In one embodiment, the width of the line structures and the gaps therebetween is between are less than 100 nm. In one embodiment, the line structures and gaps therebetween are less than 20 nm. In an embodiment, the size of the line structures and gaps may be predetermined based on the directed self-assembly polymer that is used. It should be appreciated that while the pattern members 20 are illustrated as being large in proportion to the body 32, this is for clarity purposes and the claimed invention should not be so limited. In some embodiments, the size of the pattern members 20 is not visible to an unassisted human eye. In still further embodiments, the pattern members 20 are not accessible by optical metrology (e.g. less than 100 nm in size).

Once the random feature structure 28 is formed, the pattern member 20 may be metalized using nanofabrication techniques as is known in the art. In one embodiment, the random feature structure 28 is used as a blocking mask during the metalizing process resulting in a metallic structure formed in the gaps that defines a random pattern. As discussed in more detail below, the metalized random pattern may be used as an authentication feature on a security key. The nanoscale size of the features on the pattern member 20 makes it difficult for an unauthorized person to replicate the security key. Due to the nanoscale size of the features, the unauthorized person would need access to the security key, an electron-microscope and a lithography system to replicate the key. It should be appreciated that this would make it difficult, time consuming and expensive to create an unauthorized copy of the security key.

Figure 3:
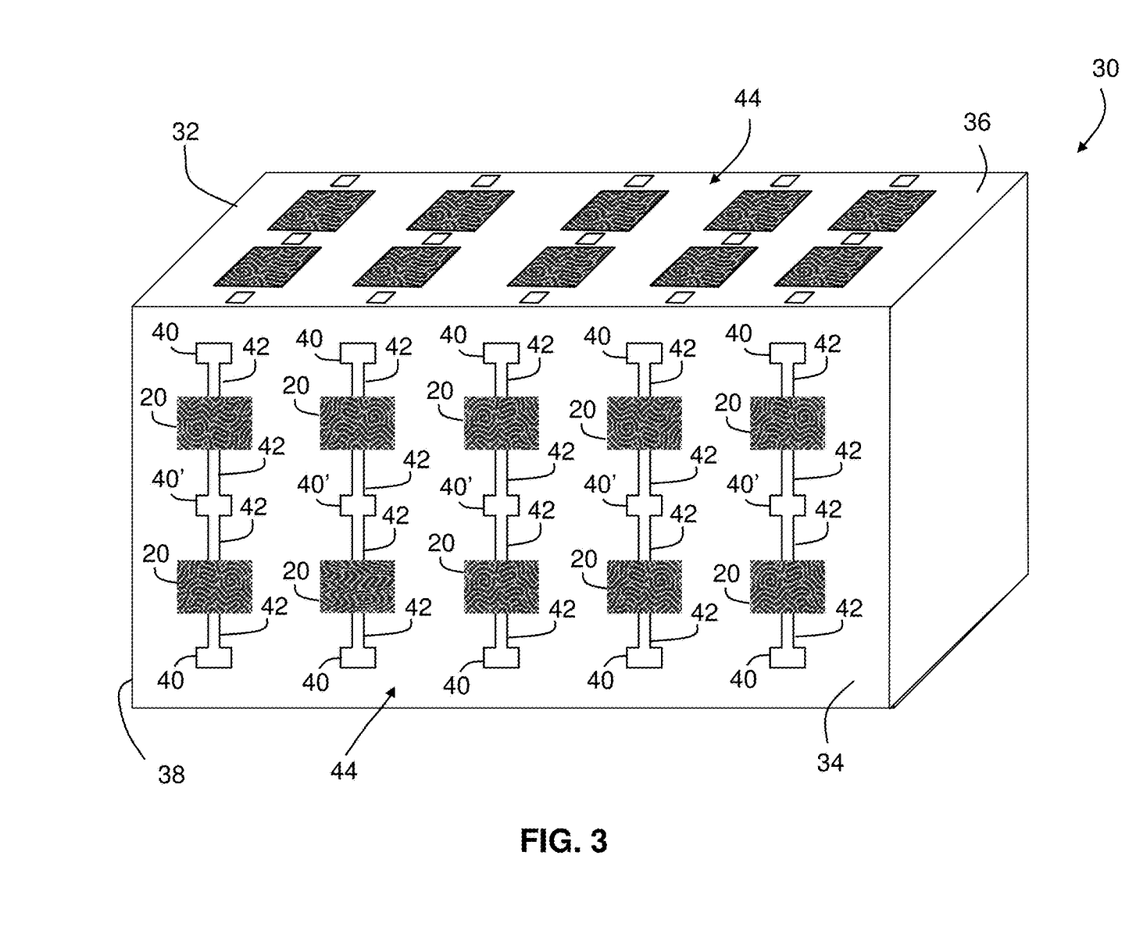
FIG. 3 depicts a perspective view of a security key that uses the pattern members of FIG. 1, according to some embodiments of this disclosure.

Turning now to FIG. 3 and exemplary embodiment of a security key 30 is shown having a plurality of pattern members 20 disposed on at least one surface. The security key 30 includes a body 32 having a plurality of sides 34, 36 that are sized and shaped to have the pattern members 20 coupled thereto. In the illustrated embodiment, the security key 30 has a rectangular shape. In an embodiment, the pattern members 20 are disposed on four sides of the body 32. In another embodiment, the pattern members 20 are disposed on an end 38. It should be appreciated that while the illustrated embodiment shows a plurality of pattern members 20, in other embodiments, the security key 30 has a single pattern member 20.

The pattern members 20 may be arranged in rows to form an array 44 of pattern members 20. In one embodiment, a contact pad 40 disposed on either side of each pattern member 20. The contact pads 40 are connected to their respective pattern members 20 by a lead 42 that electrically couples the contact pad with the pattern member 20. Some of the contact pads 40' may be coupled to multiple pattern members 20. As will be discussed in more detail herein, the contact pads allow for the measurement of a parameter, such as resistance, voltage or capacitance between two contact pads 40, 40' that are connected to the same pattern member 20. It should be appreciated that since the pattern structure 28 formed on each pattern member 20 is random, the measured parameter will be different for each pattern member 20. In an embodiment, the contact pads 40, 40' may be removed and the parameter measured directly from the pattern member 20.

In one embodiment, each side 34, 36 may include a pattern member array 44 that is arranged with a pitch between the pattern members in both directions (e.g. along the length and across the width) of 200 micrometers. For a 4 cm×2 cm body 32, this allows for a 200×100 array on each side 34, 36. When arranged on all four sides, 80,000 pads are provided, which when combined with 14 bit analog to digital conversion, a total of $1024^{80000}$ discrete physical pad combinations may be provided for use in authenticating the security key 30.

It should be appreciated that while embodiments herein describe the security key 30 as being rectangular, this is for exemplary purposes and the claimed invention should not be so limited. In other embodiments, the body 30 may have other shapes, such as cylindrical for example. Further, while embodiments herein illustrate the pattern members 20 as being connected by leads 42 and contact pads 40 on a side, this is for exemplary purposes and in other embodiments, the leads 42 may extend from one side to an adjacent side.

Figure 4:
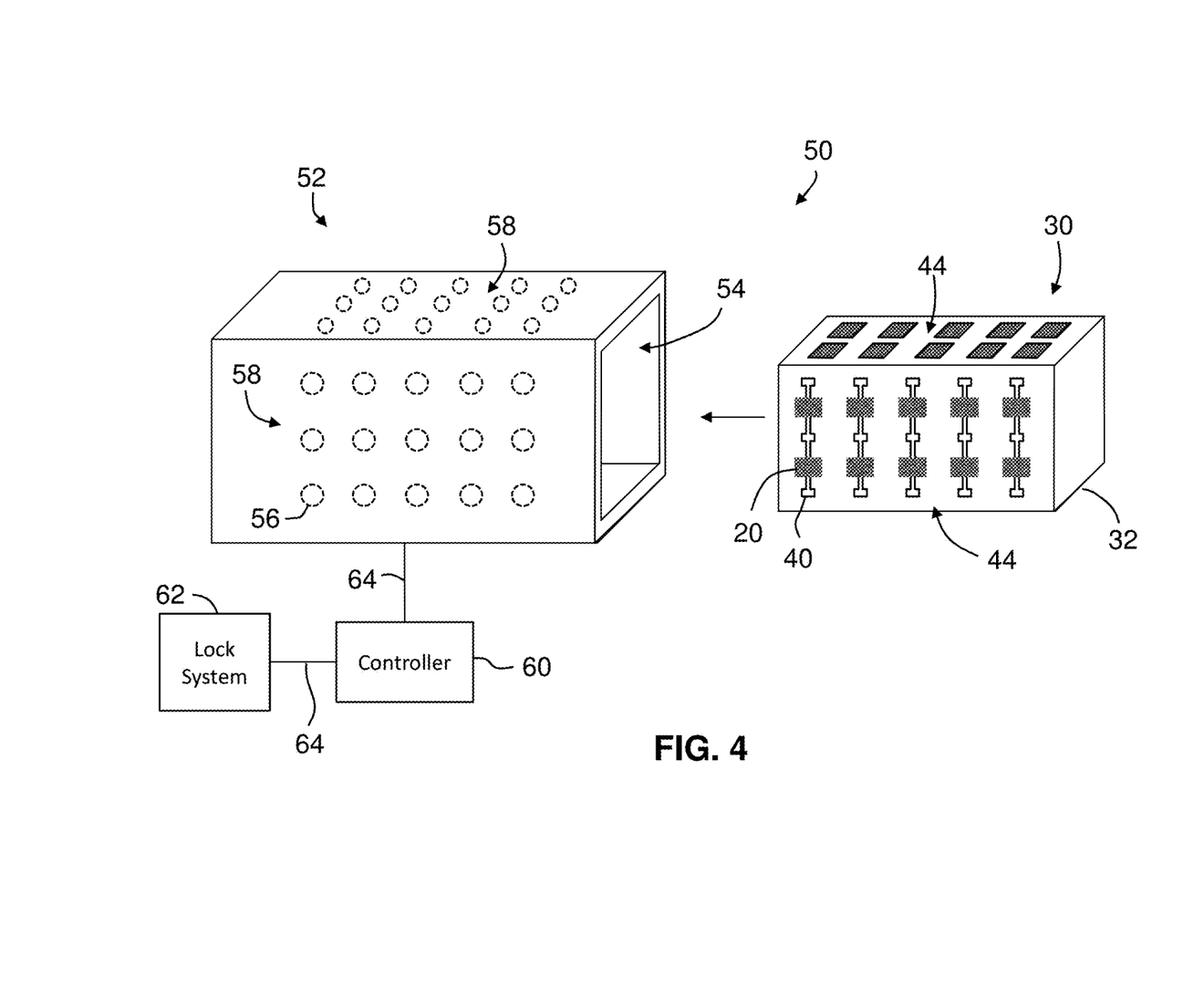
FIG. 4 depicts a perspective view of a security system, according to some embodiments of this disclosure.

Referring now to FIG. 4, an embodiment of a security system 50 is shown that uses the security key 30. The security system 50 includes a receptacle 52 having an opening 54 therein. The opening 54 is sized and shaped to receive the security key 30. The receptacle 52 further include at least one probe 56 that is arranged and configured to operably communicate with the contact pads 40 when the security key 30 is inserted into the opening 54. In an embodiment, the receptacle 52 includes an array 58 of probes 56, where each probe 56 is arranged to operably communicate with one of the contact pads 40.

The probes 56 are coupled transmit signals to a controller 60. The controller 60 may include a processor and memory for receiving the signal and providing authentication of the security key 30. Controller 60 is capable of converting the analog voltage or current level provided by probes 56 into a digital signal indicative of the parameter measured on the contact pads 40, 40'. Alternatively, probes 56 may be configured to provide a digital signal to controller 60, or an analog-to-digital (A/D) converter (not shown) maybe coupled between probes 56 and controller 60 to convert the analog signal provided by probes 56 into a digital signal for processing by controller 60. Controller 60 uses the digital signals as an input to various processes such as a lock system 62. The digital signals may represent an authentication of the security key 30 that enables the lock system 62 to disengage and allow the user access. The digital signals may also represent a failed authentication in the form of an alarm signal.

Controller 60 is operably coupled with one or more components of security system 50 by data transmission media 64. Data transmission media 64 includes, but is not limited to, twisted pair wiring, coaxial cable, and fiber optic cable. Data transmission media 64 also includes, but is not limited to, wireless, radio and infrared signal transmission systems. Controller 60 is configured to provide operating signals to these components and to receive data from these components via data transmission media 64.

In general, controller 60 accepts data from probes 56, is given certain instructions for the purpose of comparing the data from probes 56 to predetermined operational parameters, such as authentication values for security keys. Controller 60 provides operating signals to the locking system 62. The controller 60 compares the operational parameters to predetermined variances (e.g. resistance, capacitance, voltage) and if the predetermined variance matches the measured parameter, generates a signal that may be used to change the state of a system component, such as allow disengagement of the lock system 62 or trigger an alarm.

In addition to being coupled to one or more components within security system 50, controller 60 may also be coupled to external computer networks such as a local area network (LAN) and the Internet. The LAN interconnects one or more remote computers, which are configured to communicate with controller 60 using a well-known computer communications protocol such as TCP/IP (Transmission Control Protocol/Internet (^) Protocol), RS-232, ModBus, and the like. Additional security systems 50 may also be connected to the LAN with the controllers 60 in each of these security systems 50 being configured to send and receive data to and from remote computers and other security systems 50. The LAN may also be connected to the Internet. This connection allows controller 60 to communicate with one or more remote computers connected to the Internet.

In an embodiment, the controller 60 includes a processor coupled to a random access memory (RAM) device, a non-volatile memory (NVM) device, a read-only memory (ROM) device, one or more input/output (I/O) controllers. In one embodiment, the controller 60 may include a LAN interface device.

I/O controllers are coupled to the media 64 to receive signals from probes 56, and alternatively to a user interface. I/O controllers may also be coupled to analog-to-digital (A/D) converters, which receive analog data signals from probes 56.

The ROM device stores an application code, e.g., main functionality firmware, including initializing parameters, and boot code, for the processor. Application code also includes program instructions for causing processor to execute any security system 50 operation control methods, including authentication of security keys 30 and generation of alarms. The NVM device is any form of non-volatile memory such as an EPROM (Erasable Programmable Read Only Memory) chip, a disk drive, or the like. Stored in the NVM device are various operational parameters for the application code. The various operational parameters can be input to NVM device either locally, using a keypad or remote computer, or remotely via the Internet. It will be recognized that application code can be stored in NVM device rather than ROM device.

Controller 60 includes operation control methods embodied in application code. These methods are embodied in computer instructions written to be executed by processor, typically in the form of software. The software can be encoded in any language, including, but not limited to, assembly language, VHDL (Verilog Hardware Description Language), VHSIC HDL (Very High Speed IC Hardware Description Language), Fortran (formula translation), C, C++, Visual C++, Java, ALGOL (algorithmic language), BASIC (beginners all-purpose symbolic instruction code), visual BASIC, ActiveX, HTML (HyperText Markup Language), and any combination or derivative of at least one of the foregoing. Additionally, an operator can use an existing software application such as a spreadsheet or database and correlate various cells with the variables enumerated in the algorithms. Furthermore, the software can be independent of other software or dependent upon other software, such as in the form of integrated software.

It should be appreciated that while controller 60 is illustrated as being a single component, in other embodiments the methods described herein may be performed by multiple computing devices, by remotely distributed computing devices, or by computing devices arranged in a distributed or cloud computing environment. In other embodiments, the controller 60 may communicate with a remotely located authentication server or node that stores the authentication parameters. The controller 60 may communicate with the remotely located computing devices or nodes via the LAN, the Internet, or a cloud network for example. It should further be appreciated that while embodiments herein describe the controller 60 as having a processor, the controller 60 may also be embodied in the form of an analog circuit with the authentication parameters stored therein.

Figure 5:
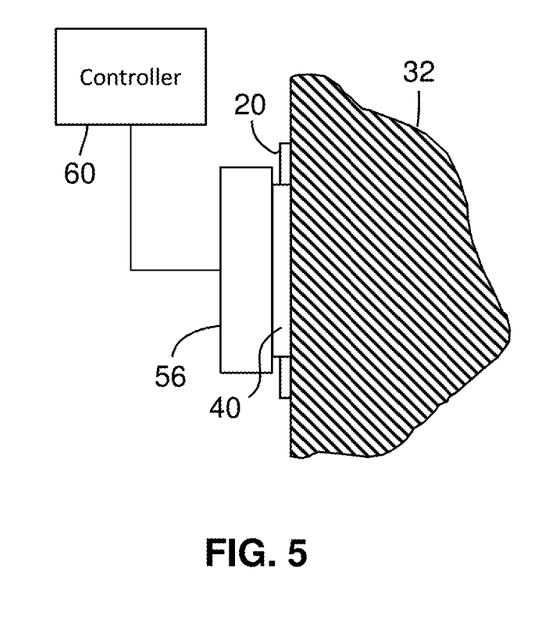
FIG. 5 depicts a partial schematic view partially in section of the security system of FIG. 4, according to some embodiments of this disclosure.

In order for the probes 56 to transmit a signal to the controller 60, the probes 56 need to operably communicate with the security key 30 when the security key 30 is inserted into the opening 54. Referring now to FIG. 5, an embodiment is illustrated where an electrical parameter, such as resistance, capacitance or voltage potential is measured. In this embodiment, the probes 56 are positioned along an inner surface of the opening 54 and positioned to engage the contact pads 40, 40'. When the security key 30 is inserted, the each probe 56 aligns with and contacts with one of the contact pads 40, 40'. Once the electrical connection is made, the probe 56 can measure the desired parameter and transmit a signal to the controller 60. It should be appreciated that in this embodiment, the number of probes 56 in the probe arrays 58 is the same as the number of contact pads 40 on the security key 30.

Figure 6:
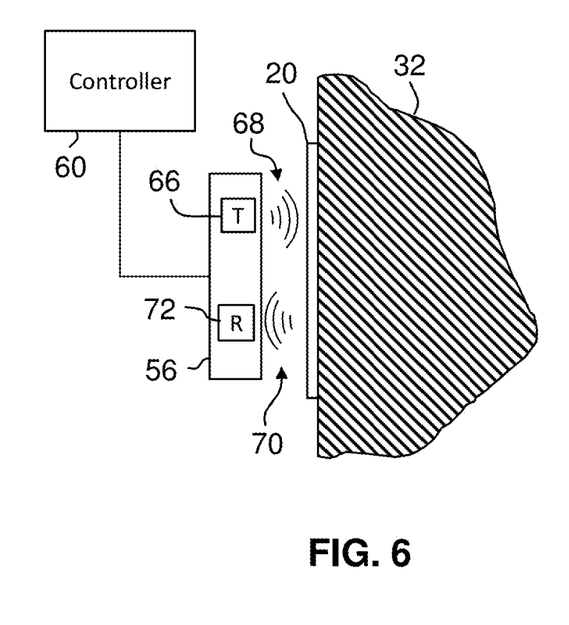
FIG. 6 depicts a partial schematic view partially in section of the security system of FIG. 4, according to some embodiments of this disclosure.

Referring now to FIG. 6, another embodiment is shown for measuring a parameter of the pattern members 20. In this embodiment, the probes 56 are positioned to be adjacent the pattern members 20 when the security key 30 is inserted into the opening 54. The probe 56 includes a transmitter 66 that is configured to transmit an electromagnetic signal 68 in a direction towards the pattern member 20. The pattern member 20 reflects a return signal 70 that is received by a receiver 72. In an embodiment, the return signal 70 is modulated by the pattern member 20 and is therefore different than the electromagnetic signal 68. It should be appreciated that each metalized pattern member 20 modulates the electromagnetic signal 68 differently than the others based at least in part on random pattern structure of the pattern member 20. Therefore, each return signal 70 represents a signature for the pattern member 20 that may be used as the parameter to authenticate the security key 30. In an embodiment, the electromagnetic signal 68 is a near field communication signal, having a wavelength of about 13.56 MHz. In another embodiment, the electromagnetic signal was a wavelength in the Teraherz band. In embodiments, the receiver 72 may be a carbon nanotube or graphene-based nano-antenna that is configured to decode an amplitude or frequency of the modulated return signal 70.

In still further embodiments, there is a single probe 56 associated with each side 34, 36 of the security key. The probe 56 emits a single electromagnetic signal 68 and the measured parameter is a sum of the return signals 70 reflected from the pattern elements 20.

Figure 7:
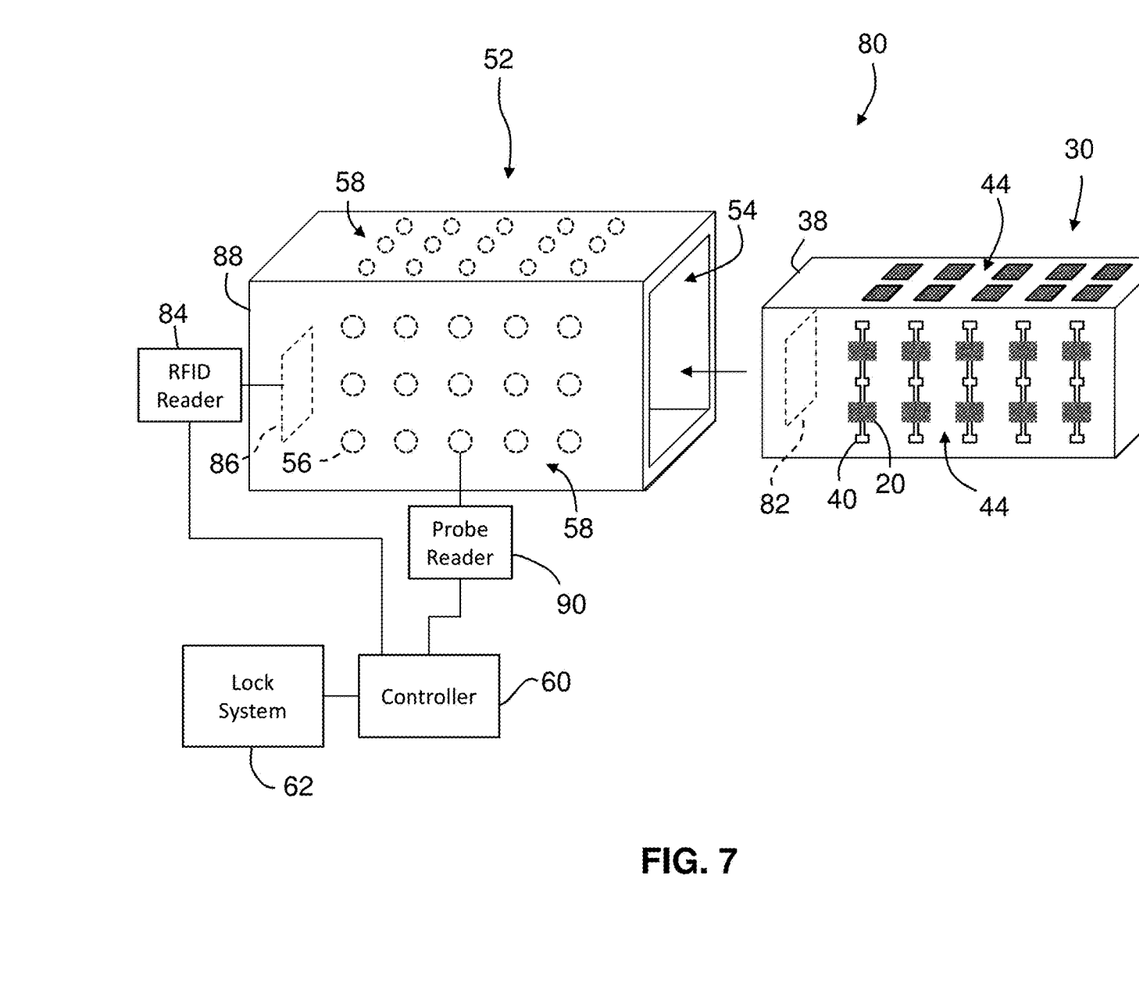
FIG. 7 depicts a perspective view of a security system, according to some embodiments of this disclosure.

Referring now to FIG. 7, another embodiment is shown for a security system 80 that incorporates the pattern members 20 with a radio frequency responsive circuit. In this embodiment, the security key 30 includes a radio frequency identification (RFID) or near field communication (NFC) circuit 82. The RFID/NFC circuit 82 is configured to allow communication with an external initiator (e.g. the RFID/NFC reader circuit 84) using a predetermined protocol, such as ISO/IEC 18000-3 for example, in response to an input electromagnetic signal (e.g. about 120-150 kHz or 13.56 MHz). In the exemplary embodiment, the RFID/NFC circuit 82 is a passive circuit that uses magnetic induction as an energy source. The RFID/NFC circuit 82 modulates the existing input electromagnetic signal to transfer data. The passive RFID/NFC circuit 82 may sometimes be colloquially referred to as a "tag." In one embodiment, the RFID/NFC circuit 82 may be an active circuit having its own energy source, such as a battery for example. The RFID/NFC circuit 82 is activated when within range of the reader circuit 84. In the exemplary embodiment, the range of the reader circuit 84 is less than 1 meter. In another embodiment, the range of the reader circuit 84 is less than 10 centimeters. The RFID/NFC circuit 82 may be located on or adjacent to the end 38.

The receptacle 52 includes the RFID/NFC reader circuit 84 that transmits an electromagnetic signal and receives a return signal from the RFID/NFC circuit 82. The RFID/NFC reader circuit 84 may include an antenna 86 that is coupled to the receptacle 52, such as at an end 88 located opposite the entrance to the opening 54. In an embodiment, the RFID/NFC reader circuit 84 and antenna 86 are configured to activate the RFID/NFC circuit 82 when the security key 30 is inserted within the opening 54 (e.g. range of less than 4 cm). The probe array 58 is coupled for communication to a probe reader 90. Both the probe reader 90 and the RFID/NFC reader circuit 84 are coupled to the controller 60. It should be appreciated that while the illustrated embodiment shows the probe reader 90 and RFID/NFC reader circuit 84 as being separate or discrete components from the controller 60, this is for exemplary purposes and in other embodiments, either of the RFID/NFC reader circuit 84 and the probe reader 90 may be integrated into the controller 60.

In the exemplary embodiment, the RFID/NFC circuit 82 includes identification data, which is transferred to the RFID/NFC reader circuit 84 when the security key 30 is inserted into the opening 54. This identification data provides a secondary authentication means for the security key 30. In an embodiment, the controller 60 may compare the identification data with the measured parameter from the probe array 58 and determine if there is a correspondence. In other words, the controller 60 determines whether the identification data transmitted from the RFID/NFC circuit 82 is the identification data associated with the pattern member arrays 44 measured by the probes 56. When there is a correspondence, the security key 30 is authenticated and the controller 60 transmits a signal to the lock system 62. In an embodiment, the identification data is encrypted on the RFID/NFC circuit 82 and is decrypted by the controller 60.

Figure 8:
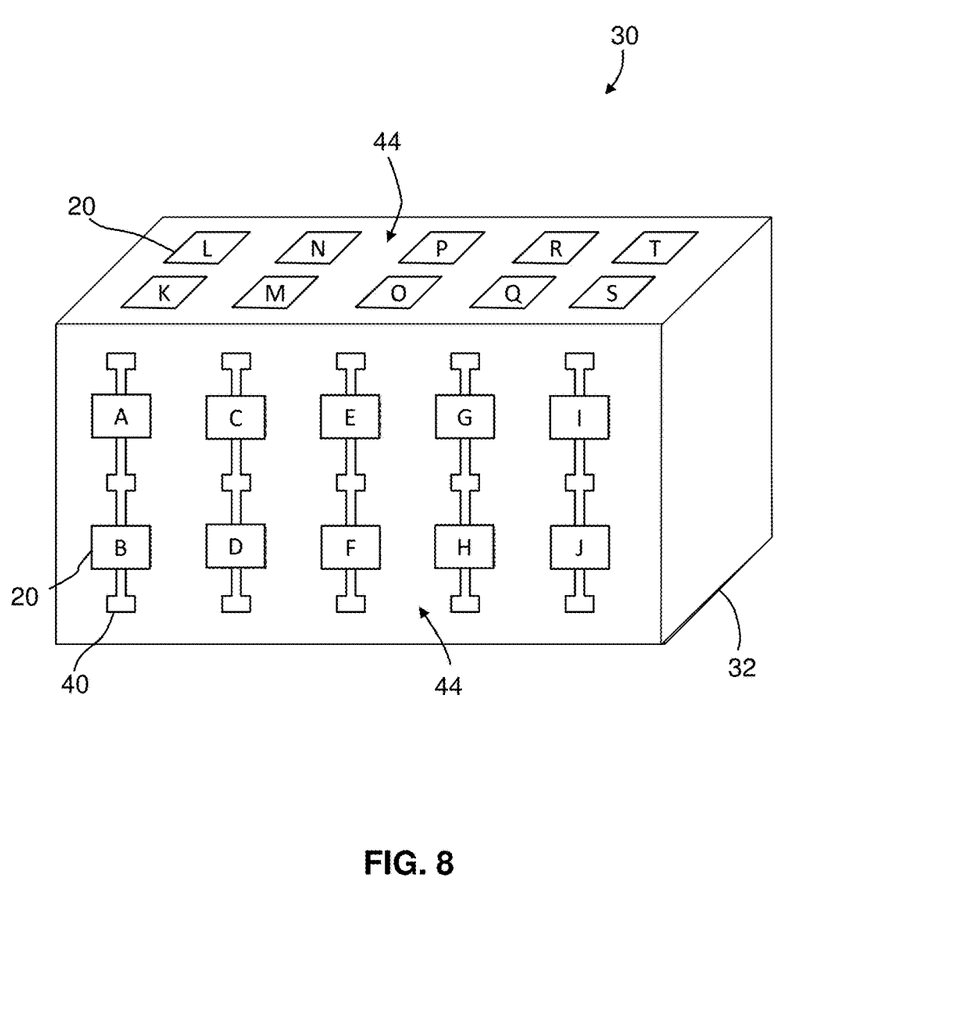
FIG. 8 depicts a perspective view of a security key, according to some embodiments of this disclosure.

Referring now to FIG. 8, an embodiment is shown that increases the difficulty of creating an unauthorized duplicate of the security key 30. In this embodiment, the parameter for each of the pattern members 20 may be individually determined such that some of the pattern members 20 may be measured by the probe array 58 while others may remain unmeasured. Since an unauthorized person attempting to duplicate the security key will not know which pattern members 20 are being measured by the controller 60, it may be more difficult to replicate the key. Further, in some embodiments, the security key 30 may be used with multiple receptacles 52. For example, multiple keys may be authorized to open a bank vault, but then each individual key is only authorized to open a subset (or an individual) of the safety deposit boxes. Thus the security keys 30 for different users may share a common subset of the pattern member array. For example, each of the security keys 30 may have identical pattern members "A", "B", "K", "L", "F", "E", "O", "P" that authenticates with a receptacle associated with a bank vault or a lobby door for example. Since each of the security keys 30 has a common subset of pattern members 20, all of these security keys 30 will authenticate at this receptacle. The remainder of the pattern elements (e.g. "C", "D", "Q", "R") may then be used to authenticate other secured access areas, such as safety deposit boxes or computer terminals for example.

Figure 9:
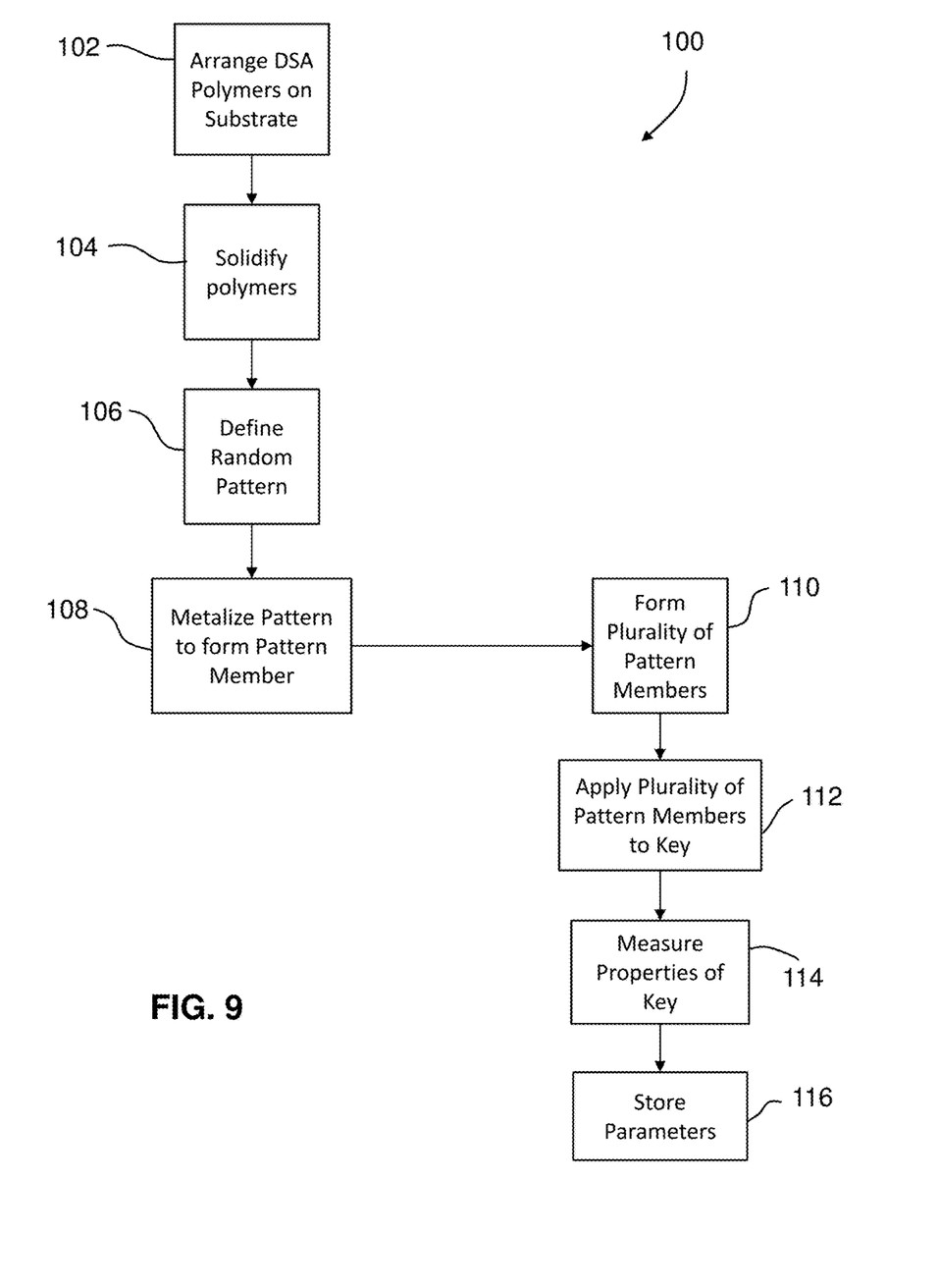
FIG. 9 depicts a flow diagram of a method for fabricating a security key with a pattern member, according to some embodiments of this disclosure.

Referring now to FIG. 9, a method 100 is shown for fabricating a security key 30 having nanoscale authentication features. The method 100 starts in block 102 where the directed self-assembly polymers are arranged on a substrate. In an embodiment, two directed self-assembly polymers each have a different length and are positioned end to end in an alternating arrangement. In some embodiments, more than two directed self-assembly polymers are used. The method 100 then proceeds to block 104 where the polymers are polymerized to form a solid. The method 100 then proceeds to block 106 where one of the two polymers is removed to define a random pattern formed by the remaining polymer on the substrate. In an embodiment, the directed self-assembly polymers are chosen to have a predetermined feature size when solidified. Next, in block 108, the pattern is metalized to form the pattern member having a random pattern structure thereon. In an embodiment, the polymer that remained on the substrate is used as a blocking mask during the metalizing process.

The method 100 then proceeds to block 110 where a plurality of pattern members are formed by repeating blocks 102-108 until the desired number of pattern members have been fabricated. The formed pattern members are applied to the security key body along with the contact pads and leads. The patterns members and contact pad are electrically connected in block 112. The parameters for each of the pattern members are next measured in block 114 so that the key may be authenticated. Finally, the measured parameters are stored (such as in memory associated with the controller) in block 116.

It should be appreciated that while embodiments herein referred to a particular secured area or thing, such as a bank vault, safety deposit box or door for example, this is for exemplary purposes and the claimed invention should not be so limited. Embodiments of the security key and security system may be used in any application where authentication may be desired. For example, the security system may be used with a computer system where the receptacle is coupled to a computer terminal, such as to authorize a financial transaction. In still other embodiments, the security system may be used to initiate processes rather than prevent access, such as a manufacturing process where the workers need to exit the area before the process is initiated. The key may be used to authenticate that the workers have exited the area and thus allow the process to start.

Technical effects and benefits of some embodiments include the authentication of a key by measuring a parameter associated with pattern elements having a nanoscale random pattern formed thereon.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiments were chosen and described in order to best explain the principles of the invention and the practical application, and to enable others of ordinary skill in the art to understand the invention for various embodiments with various modifications as are suited to the particular use contemplated.

The present invention may be a system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punchcards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Java, Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A key for a security system comprising:
a body; and
at least one pattern member disposed on the body, the at least one pattern member formed using a directed self-assembly polymer formed from a first polymer and a second polymer, the first and second polymer each having a different length and arranged in an alternating arrangement, the first polymer and second polymer configured to define a metalized pattern of electrically conductive random feature structures thereon, the feature structures having a width of less than 100 nanometers.

2. The key of claim 1, wherein the at least one pattern member includes a plurality of pattern members, each of the pattern members being formed using the directed self-assembly polymer to define the pattern of random feature structures thereon, each of the random feature structures being different from other random feature structures.

3. The key of claim 2, further comprising at least a pair of contacts coupled to the body and electrically coupled to at least one of the plurality of pattern members.

4. The key of claim 3, wherein the at least the pair of contacts includes a plurality of pairs of contacts, each of pairs of the plurality of pairs of contacts being electrically coupled to one of the pattern members of the plurality of pattern members.

5. The key of claim 2, wherein the at least a pair of contacts includes a plurality of contacts, each of the plurality of contacts being arranged with two other contacts to electrically couple two pattern members of the plurality of pattern members.

6. The key of claim 2, wherein:
the body includes a first side and a second side; and
a first plurality of pattern members of the plurality of pattern members is arranged on the first side and a second plurality of pattern members of the plurality of pattern members is arranged on the second side.

7. The key of claim 2, wherein each of the plurality of pattern members has a feature pitch of 200 in a first direction and a second direction.

8. The key of claim 1, further comprising a radio frequency identification circuit coupled to the body.

9. A security system comprising:
a key having a body with a pattern member disposed on the body, the pattern member formed using a directed self-assembly polymer formed from a first polymer and a second polymer, the first polymer and second polymer each having a different length and arranged in an alternating arrangement, to define a pattern of random feature structures thereon, the feature structures having a width of less than 100 nanometers; and a receptacle having an opening sized to receive the body and at least a pair of probes operably coupled to the receptacle, the at least the pair of probes being positioned to operably communicate with the at least one pattern member to measure a parameter.

10. The security system of claim 9, wherein:

the at least one pattern member includes a plurality of pattern members, each of the pattern members being formed using the directed self-assembly polymer to define the pattern of random feature structures thereon, each of the random feature structures being different from other random feature structures; and the at least the pair of probes includes a plurality of probes, each of the plurality of probes being positioned to operably communicate with one of the plurality of pattern members when the body is received within the opening.

11. The security system of claim 10, wherein the key further including at a plurality of contacts, each of pairs of the plurality of pattern members being electrically coupled to two of the plurality of contacts, the plurality of probes being arranged to engage the plurality of contacts when the body is received within the opening.

12. The security system of claim 11, wherein the parameter is a measurement of resistance, voltage or capacitance between a pair of contacts.

13. The security system of claim 10, wherein the at least the pair of probes are configured to transmit a radio frequency signal and the at least one pattern member is configured to reflect the radio frequency signal.

14. The security system of claim 10, wherein each of the plurality of pattern members has a feature pitch of 200 in a first direction and a second direction.

15. The security system of claim 9, further comprising a radio frequency identification circuit coupled to the body.

16. A method comprising:

arranging a first directed self-assembly polymer having a first length on a substrate;

arranging a second directed self-assembly polymer having a second length on the substrate, an end of the second directed self-assembly polymer being coupled to an end of the first directed self-assembly polymer;

solidifying the first directed self-assembly polymer and the second directed self-assembly polymer on the substrate;

removing the second directed self-assembly polymer to define a pattern by the first directed self-assembly polymer, the pattern being defined by a plurality of random feature structures thereon, the feature structures having a width of less than 100 nanometers;

forming a pattern member by metalizing the first directed self-assembly polymer;

coupling the pattern member to a key body;

measuring a key parameter of the pattern member;

engaging the key body with a receptacle;

measuring a measured parameter of the key body; and disengaging a security system based the measured parameter being equal to the key parameter.

17. The method of claim 16, wherein the measuring the measured parameter includes engaging probes to contacts, the contacts being electrically coupled to the pattern member.

18. The method of claim 16, wherein the measuring the measured parameter further includes transmitting an electromagnetic signal from a probe towards the pattern member, modulating the electromagnetic signal with the pattern member, and receiving the modulated electromagnetic signal with the probe.

19. The method of claim 16, further comprising:

forming a plurality of pattern members, each of the plurality of pattern members having random feature structure defined thereon, each of the random feature structures being different than other random feature structures; and measuring at least one measured parameter from a portion of the plurality of pattern members.

20. The method of claim 16 wherein the first directed self-assembly polymer and the second directed self-assembly polymer are a poly(styrene-block-methymethacrylate) (PS-b-PMMA) polymer.

* * * * *